United States Patent
Sanjeevarao et al.

(10) Patent No.: US 7,692,989 B2
(45) Date of Patent: Apr. 6, 2010

(54) NON-VOLATILE MEMORY HAVING A STATIC VERIFY-READ OUTPUT DATA PATH

(75) Inventors: Padmaraj Sanjeevarao, Austin, TX (US); David W. Chrudimsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 305 days.

(21) Appl. No.: 11/740,331

(22) Filed: Apr. 26, 2007

(65) Prior Publication Data

US 2008/0266974 A1 Oct. 30, 2008

(51) Int. Cl.
*G11C 7/00* (2006.01)
(52) U.S. Cl. ............... 365/205; 365/191; 365/201; 365/189.14; 365/189.15
(58) Field of Classification Search ............ 365/205, 365/191, 201, 189.14, 189.15
See application file for complete search history.

(56) References Cited

U.S. PATENT DOCUMENTS

| | | | |
|---|---|---|---|
| 4,745,579 A | * | 5/1988 | Mead et al. ............ 365/104 |
| 6,930,941 B2 | * | 8/2005 | Nakase ................. 365/205 |
| 7,088,625 B2 | * | 8/2006 | Merritt et al. .......... 365/189.05 |
| 2003/0043664 A1 | * | 3/2003 | Haraguchi et al. ...... 365/201 |

* cited by examiner

*Primary Examiner*—Pho M. Luu
(74) *Attorney, Agent, or Firm*—Daniel D. Hill; James L. Clingan, Jr.

(57) ABSTRACT

A memory has first and second memory arrays and first and second sense amplifiers coupled to the first and second memory arrays, respectively. A verify data line is coupled to first outputs of the first sense amplifier and the second sense amplifier as well as to a program/erase controller. The verify data line has a first logic circuit having a first input coupled to the first output of the first sense amplifier and an output. A second logic circuit has a first input coupled to the output of the first logic circuit, a second input coupled to the first output of the second sense amplifier, and an output. A global data line is coupled to a second output of the first sense amplifier and a second output of the second sense amplifier. A global sense amplifier is coupled to the global data line.

20 Claims, 2 Drawing Sheets

NON-VOLATILE MEMORY HAVING A STATIC VERIFY-READ OUTPUT DATA PATH

BACKGROUND

1. Field

This disclosure relates generally to non-volatile memories, and more specifically, to a non-volatile memory having a static verify-read output data path.

2. Related Art

Floating gate non-volatile memories such as erasable programmable read only memories (EPROMs), electrically erasable programmable read only memories (EEPROMs), block erasable ("flash") EEPROMs, and one time programmable read only memories (OTPROMs) are popular for many electronic applications such as automotive control, consumer products such as tapeless answering machines, and the like. In floating gate memories, a programmed state of each memory cell is determined by the amount of charge stored on a floating gate. The stored charge determines the threshold voltage (VT) of the cell. The floating gate is isolated from an underlying channel by a region of tunnel oxide. Typically, the floating gate transistor is programmed and erased by processes known as Fowler-Nordheim tunneling and hot carrier injection. Care must be taken when programming or erasing a non-volatile memory cell to fully shift the VT while avoiding over programming or over erasing the cell. One way to protect against over erasing or over programming is to use multiple program or erase pulses with a verify-read operation after each pulse to determine if the cell is fully programmed or erased.

In some flash memories, a separate read path is used for verify operations. The separate verify path is used to allow a program or erase operation to occur at the same time as a normal read operation. The verify read output path is separate from the normal read path so that flash performance is not affected. One prior art flash memory uses a tristateable driver coupled to a verify global data line dedicated to verify-read operations.

The use of a tristateable driver requires the overhead of timed control signals to properly precharge and evaluate the verify global data line. Also, the tristateable driver is usually single-ended and does not easily allow the use of a symmetrical sense amplifier layout. A symmetrical sense amplifier that uses differential signals is desirable for more reliable high speed sensing. In addition, the tristateable driver typically requires a large surface area of an integrated circuit die to implement, thus increasing the size and cost of the integrated circuit.

Therefore, a need exists for a way to solve the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

One aspect of the illustrated embodiment includes a memory, comprising: a first memory array; a first sense amplifier coupled to the first memory array that senses data from the first memory array; a second memory array; a second sense amplifier coupled to the second memory array that senses data from the second memory array; a verify data line coupled to first output of the first sense amplifier and the first output of the second sense amplifier, wherein the verify data line comprises: a first logic circuit having a first input coupled to the first output of the first sense amplifier and an output; and a second logic circuit having a first input coupled to the output of the first logic circuit, a second input coupled to the first output of the second sense amplifier, and an output; a program/erase controller coupled to the output of the second logic circuit; a global data line coupled to a second output of the first sense amplifier and a second output of the second sense amplifier; and a global sense amplifier coupled to the global data line.

Another aspect of the illustrated embodiment includes a method of operating a memory having a plurality of memory arrays coupled to both a first read path and a second read path, comprising: reading data from a first selected memory array of the plurality of memory arrays by coupling data to the first read path; and contemporaneously reading data from a second selected memory array of the plurality of memory arrays in which a logic operation is performed in the second read path for each memory array of the plurality of memory arrays.

Yet another aspect of the illustrated embodiment includes a memory having a first mode and a second mode of operation, wherein the first mode can function contemporaneously with the second mode, comprising: a first memory array; a first sense amplifier coupled to the first memory array that senses data from the first memory array; a second memory array; a second sense amplifier coupled to the second memory array that senses data from the second memory array; a verify data line coupled to first output of the first sense amplifier and first output of the second sense amplifier, wherein the verify data line comprises: a first continuous segment; a second continuous segment; a first logic circuit having a first input coupled to the first output of the first sense amplifier and an output coupled to a first end of the first continuous segment; and a second logic circuit having a first input coupled to a second end of the first continuous segment, a second input coupled to the first output of the second sense amplifier, and an output coupled to a first end of the second segment; a program/erase controller coupled to a second end of the second segment; a global data line coupled to second output of the first sense amplifier and a second output of the second sense amplifier; and a global sense amplifier coupled to the global data line.

Figure 1:
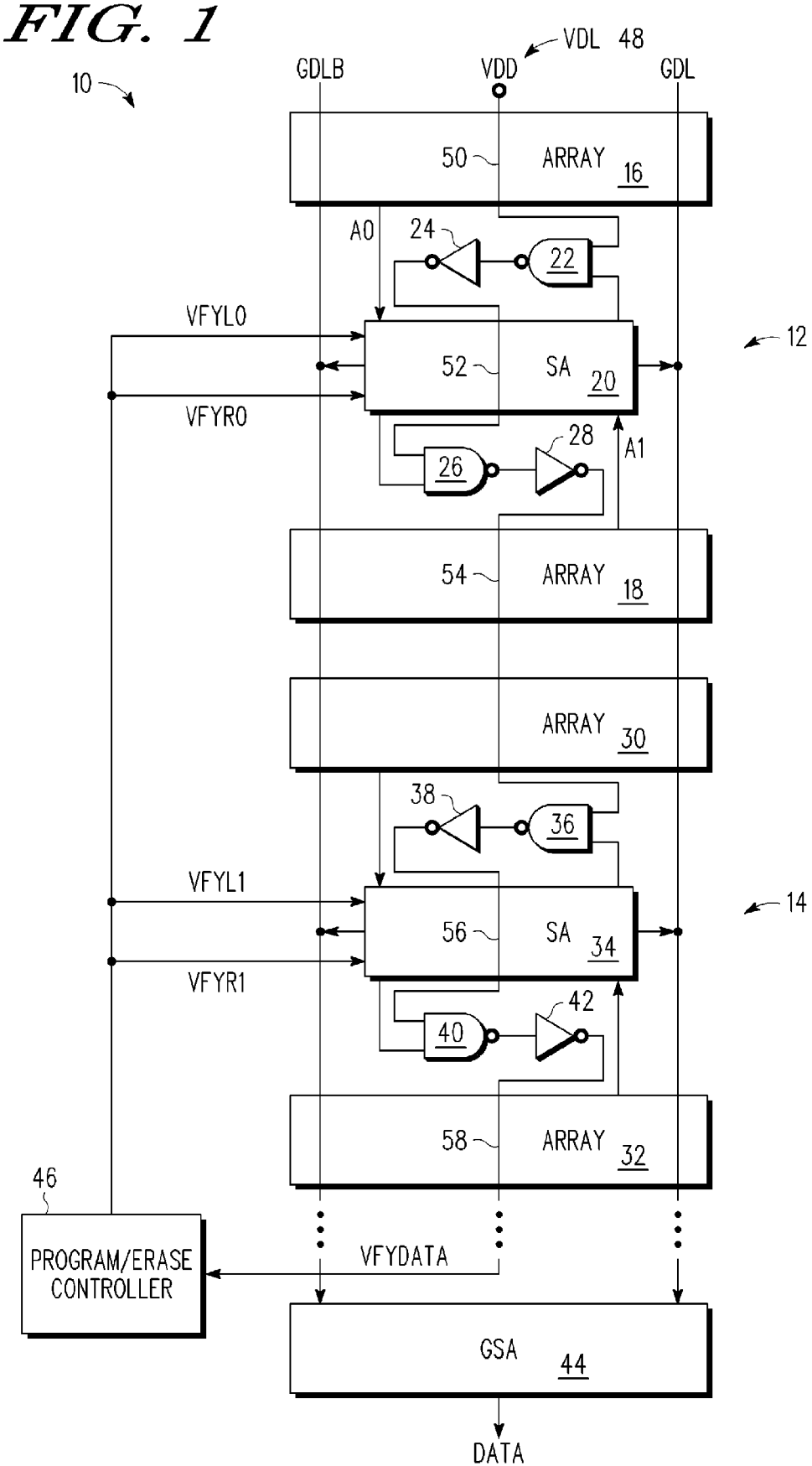
FIG. 1 illustrates, in partial block diagram form and partial logic diagram form, a non-volatile memory in accordance with an embodiment.

FIG. 1 illustrates, in partial block diagram form and partial logic diagram form, a non-volatile memory 10 in accordance with one embodiment. Non-volatile memory 10 includes memory blocks 12 and 14, global sense amplifier 44, and program/erase controller 46. Memory block 12 includes memory arrays 16 and 18, sense amplifier 20, NAND logic gates 22 and 26, and inverters 24 and 28. Memory block 14 includes memory arrays 30 and 32, sense amplifier 34, NAND logic gates 36 and 40, and inverters 38 and 42. Read global data lines labeled "GDL" and "GDLB" traverse memory arrays 16, 18, 30, and 32 and are coupled to differential output terminals of sense amplifiers 20 and 34. Read global data lines GDL and GDLB also couple to global sense amplifier 44. Global sense amplifier 44 then provides a single-ended data signal labeled "DATA". Note that a "B" at the end of a signal name indicates that the signal is a logical complement of a signal having the same name but lacking the "B". Also note that memory blocks 12 and 14 are representative of a plurality of memory blocks. In another embodiment there may be more than two memory blocks.

In memory block 12, sense amplifier 20 is coupled to memory arrays 16 and 18 for receiving read data signals labeled "A0" and "A1", respectively. A verify data line 48, labeled "VDL" includes a plurality of verify data line segments 50, 52, 54, 56, 58. Verify data line segment 50 is formed above the memory arrays 16 and 18 and has one end coupled to a power supply voltage terminal labeled "VDD". Line segment 50 does not couple directly to the memory array 16 as it crosses over memory array 16. NAND logic gate 22 has a first input coupled to the line segment 50, a second input coupled to an output of sense amplifier 20, and an output coupled to an input of inverter 24. Inverter 24 also has an output coupled to verify data line segment 52. Data line segment 52 is coupled to a first input of NAND logic gate 26. NAND logic gate 26 has a second input coupled to an output of sense amplifier 20, and an output coupled to an input of inverter 28. Inverter 28 has an output coupled to verify data line segment 54. Verify data line segment 52 is formed above sense amplifier 20, and verify data line segment 54 is formed above memory array 18. The verify data line 48 is characterized as being a "static" data line, where the word static means that the data line is always being driven. This is contrasted to a tristateable data line that may not always be driven. By being static, the verify data line 48 provides an advantage of not requiring clocked tristate control signals.

In memory block 14, sense amplifier 34 is coupled to memory arrays 30 and 32. Verify data line segment 54 is formed above the memory array 30, but does not couple directly to the memory array 30 as it crosses. NAND logic gate 36 has a first input coupled to the data line segment 54, a second input coupled to an output of sense amplifier 34, and an output coupled to an input of inverter 38. Inverter 38 also has an output coupled to verify data line segment 56. Data line segment 56 is coupled to a first input of NAND logic gate 40. NAND logic gate 40 has a second input coupled to an output of sense amplifier 34, and an output coupled to an input of inverter 42. Inverter 42 has an output coupled to verify data line segment 58. Verify data line segment 56 is formed above sense amplifier 34, and verify data line segment 58 is formed above memory array 32.

Memory arrays 16, 18, 30, and 32 each include a plurality of conventional flash type non-volatile memory cells, where each cell is coupled to a word line and a bit line (not shown). In another embodiment, the memory arrays may include other types of non-volatile memory cells that use a verify step as part of programming and erase operations. Each of the memory cells of memory arrays 16 and 18 is coupled to inputs of sense amplifier 20. Likewise, each of the memory cells of memory array 30 and 32 is coupled to input of sense amplifier 34. The outputs of each sense amplifier 20 and 34 are coupled to the read global data lines GDL and GDLB. Note that the output data path includes column decoding and other column logic that is not shown in FIG. 1. Each of the memory cells are also coupled to write data lines (not shown) for programming operations. Program/erase controller 46 controls program and erase operations in memory 10. Program/erase controller 46 has an input coupled to receive a verify data signal labeled "VFY DATA", and a plurality of outputs for providing control signals labeled "VFYL0", "VFYR0", "VFYL1", and "VFYR1". There may be other control signals provided by program/erase controller 46, but only the most relevant control signals for the illustrated embodiment are shown in the interest of clarity and simplicity.

Generally, when a memory cell is read during a normal read operation during a first operating mode, a voltage is produced on the bit line coupled to the memory cell being read. The voltage represents a logic state stored by the cell. The bit line is coupled to a sense amplifier, for example, sense amplifier 20. Sense amplifier 20 senses and amplifies the logic state stored by the cell and provides the logic state in the form of differential signals, in the illustrated embodiment, to global data lines GDL and GDLB. The global data lines are coupled to global sense amplifier 44, which further amplifies the logic state stored by the cell and provides data signal DATA to output circuitry (not shown). Memory 10 of the illustrated embodiment is embedded as part of an integrated circuit having a microcontroller (not shown). In other embodiments, memory 10 may be a "stand alone" memory or may be included with other circuit types.

Memory 10 has a first mode and a second mode of operation, wherein the first mode can function contemporaneously with the second mode. The first mode comprises writing data and verifying that data has been written; and the second mode comprises reading data. For purposes of the present application, a "write" operation is defined as either a program operation or an erase operation. Write operations in many non-volatile memories are performed in steps, where in each step, a program or erase voltage to change the VT of the cell is provided as a relatively short duration pulse. Each program or erase step ends with a verify-read operation. The verify-read operation is used to determine if the cell has been fully programmed or erased by checking the VT of the cell. The verify data is provided to the verify data line 48 by a sense amplifier, such as sense amplifier 20. In the illustrated embodiment, the sense amplifier used for verify operations is the same sense amplifier used to sense the logic state of a memory cell during a normal read operation. The data is transmitted along the verify-read data path 48 and a corresponding data signal VFY DATA is provided to program/erase controller 46. Program/erase controller 46 uses the data signal VFY DATA to determine if the memory cell being written needs another program or erase step to be fully programmed or erased.

More specifically, during a verify-read operation of a memory cell of memory array 16 a signal A0 corresponding to the bit line voltage will be provided to sense amplifier 20. Sense amplifier 20 will provide an amplified verify-read data signal to an input of NAND logic gate 22. Note that sense amplifier 20 will be discussed in more detail in the discussion of FIG. 2. Because VDD is coupled to the other input of NAND logic gate 22, an output signal of inverter 24 will correspond to the logic state of the selected cell. Line segment 52 couples the output of inverter 24 to an input of NAND logic gate 26. The other input of NAND logic gate 26 receives a non-competing value from sense amplifier 20 in response to signals VFYL0 and VFYR0 from program/erase controller 46. In this case the non-competing value is a logic one. The sensed logic state of the cell will propagate along the cascaded logic and line segments of verify data line 48 until reaching program/erase controller 46.

The verify-read data line VDL 48 of the illustrated embodiment provides the advantage of reduced control signals because tristateable drivers are not used. Also, the NAND logic gates and inverters are smaller because they drive shorter line segments. In addition, the generally smaller device sizes can be implemented in a memory with a reduced "pitch" of the memory cells in the memory array. Note that in another embodiment, the type of logic gates used for verify-read data line VDL 48 may be different.

Because the verify-read operations use a separate dedicated output path, a verify-read operation can occur contemporaneously with a normal read operation. That is, if a verify-read operation is occurring in one memory block, for example memory block 12, one or more normal read operations can be occurring in another memory block, such as memory block 14. Also, using a separate verify-read data path takes the verify operation out of a speed critical path for those non-volatile memories where access speed is important.

Figure 2:
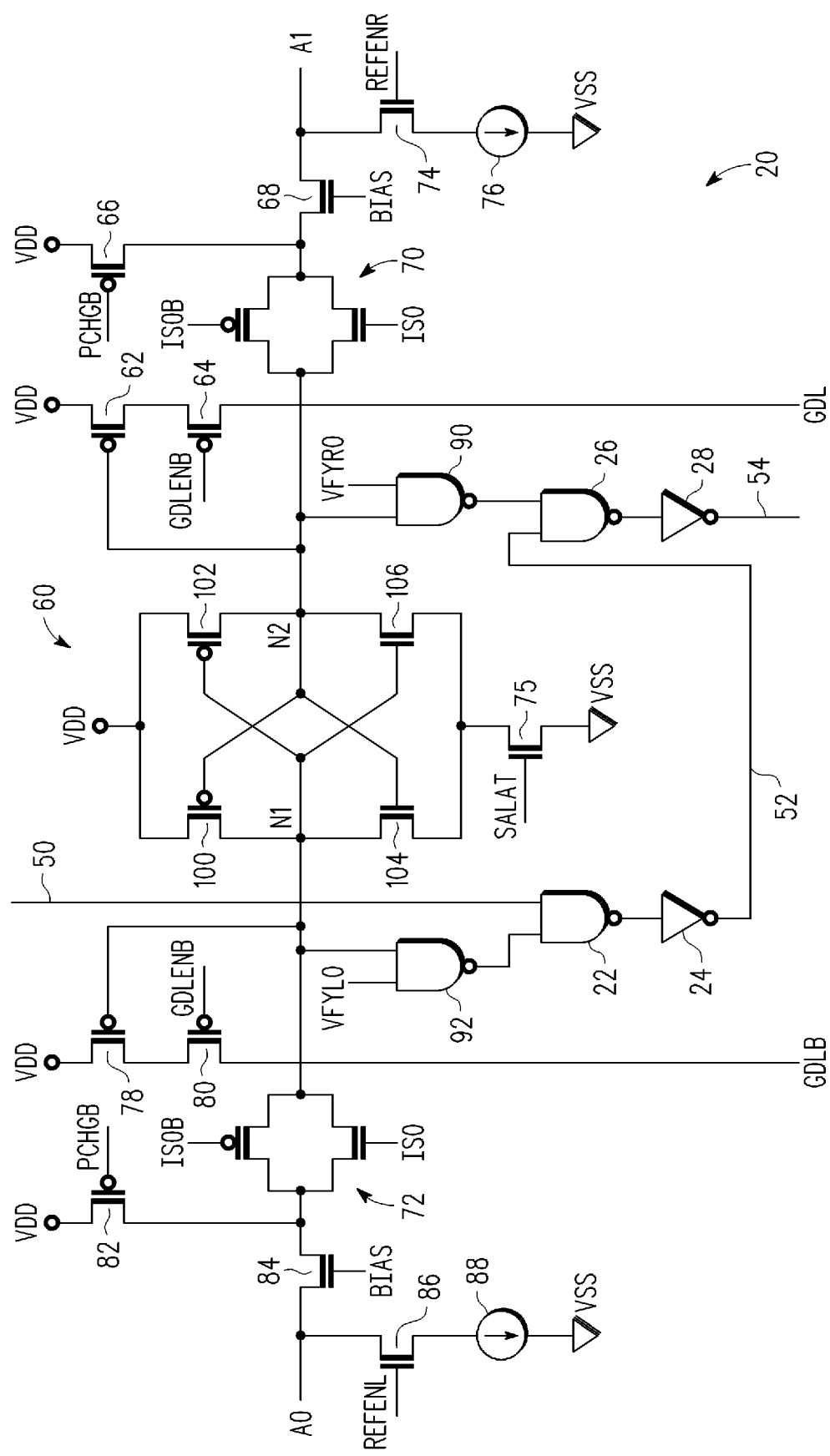
FIG. 2 illustrates, in schematic diagram form, the sense amplifier of the non-volatile memory of FIG. 1.

FIG. 2 illustrates, in schematic diagram form, the sense amplifier 20 of the non-volatile memory 10 of FIG. 1. Sense amplifier 20 includes cross-coupled latch 60, P-channel transistors 62, 64, 66, 78, 80, 82, N-channel transistors 68, 74, 75, 84, and 86, NAND logic gates 22, 26, 90, 92, inverters 24 and 28, transmission gates 70 and 72, and current sources 76 and 88. Cross-coupled latch 60 includes P-channel transistors 100 and 102 and N-channel transistors 104 and 106.

Cross-coupled latch 60 is a conventional latch circuit having a pair of cross-coupled inverters, where transistors 100 and 104 form one inverter and transistors 102 and 106 form the other inverter. Storage nodes N1 and N2 are input/output terminals for latch 60. P-channel transistor 62 has a first current electrode coupled to power supply voltage VDD, a second current electrode, and a control electrode coupled to storage node N2. P-channel transistor 64 has a first current electrode coupled to the second current electrode of transistor 62, a second current electrode coupled to read global data line GDL, and a control electrode coupled to receive global data line enable control signal GDLENB. Transmission gate 70 has an input terminal coupled to storage node N2, an output terminal, and control terminals for receiving isolation control signal labeled "ISO" and "ISOB". N-channel transistor 74 has a first current electrode coupled to a terminal labeled "A1", a control electrode for receiving clocked reference enable control signal REFENR, and a second current electrode. Current source 76 has a first terminal coupled to the second current electrode of transistor 74, and a second terminal coupled to a power supply voltage terminal labeled "VSS". Power supply voltage terminal VSS is typically coupled to ground. N-channel transistor 68 has a first current electrode coupled to the output terminal of transmission gate 70, a second current electrode coupled to terminal A1, and a control terminal for receiving a bias signal labeled "BIAS". P-channel transistor 66 has a first current electrode coupled to power supply voltage terminal VDD, a second current electrode coupled to the output terminal of transmission gate 70, and a control electrode for receiving a precharge signal labeled "PCHGB". Precharge signal PCHGB is for precharging the output terminal of transmission gate 70 prior to a read operation or a verify-read operation. P-channel transistor 78 has a first current electrode coupled to VDD, a second current electrode, and a control electrode coupled to storage node N1. P-channel transistor 80 has a first current electrode coupled to the second current electrode of transistor 78, a second current electrode coupled to read global data line GDLB, and a control electrode for receiving control signal GDLENB. Transmission gate 72 has an input terminal coupled to storage node N1, an output terminal, and control terminals for receiving isolation control signal labeled "ISO" and "ISOB". P-channel transistor 82 has a first current electrode coupled to VDD, a second current electrode coupled to the output terminal of transmission gate 72, and a control terminal for receiving precharge signal PCHGB. N-channel transistor 84 has a first current electrode coupled to the output terminal of transmission gate 72, a second current electrode coupled to terminal A0, and a control electrode for receiving a bias signal labeled "BIAS". N-channel transistor 86 has a first current electrode coupled to the second terminal of transistor 84, a second current electrode, and a control electrode for receiving reference enable control signal REFENL. Current source 88 has a first terminal coupled to the second current electrode of transistor 86, and a second terminal coupled to power supply voltage terminal VSS. NAND logic gate 90 has a first input terminal for receiving verify right control signal VFYR0, a second input terminal coupled to storage node N2, and an output terminal. NAND logic gate 26 (also see FIG. 1) has a first input terminal coupled to the output terminal of NAND logic gate 90, a second input terminal coupled to the output terminal of inverter 24 via line segment 52, and an output terminal coupled to the input terminal of inverter 28. Inverter 28 has an output terminal coupled to line segment 54. NAND logic gate 92 has a first input terminal coupled to receive verify left control signal VFYL0, a second input terminal coupled to storage node N1, and an output terminal. NAND logic gate 22 has a first input terminal coupled to the output terminal of NAND logic gate 92, a second input terminal coupled to line segment 50 (see FIG. 1), and an output terminal coupled to an input of inverter 24. Inverter 24 has an output terminal coupled to line segment 52.

Generally, during a verify-read operation, a bit line signal is provided to A0 or A1 depending on which of memory arrays 16 or 18 is selected for a program or erase operation. If for example, memory array 16 is being subjected to a verify-read operation after receiving a program or erase pulse, a bit line signal is provided to A0 by the selected memory cell. Reference enable control signal REFENL is a logic low voltage so that transistor 86 is substantially non-conductive. Control signal REFENR is a logic high voltage so that transistor 74 is conductive, allowing current source 76 to relatively weakly pull-down a voltage at A1 and subsequently node N2 of latch 60. Control signals REFENL and REFENR are clocked control signals so that neither is asserted as a logic high at the same time. Latch 60 is enabled when control signal SALAT is asserted as a logic high. Transmission gates 70 and 72 are conductive. If the bit line signal is a logic zero, the differential between N1 and N2 will cause latch 60 to store a logic zero at node N1. Conversely, if the bit line signal is a logic one, latch 60 will store a logic one at node N1. The logic state of node N1 is provided to an input of NAND logic gate 92 and the logic state of node N2 is provided to an input of NAND logic gate 90. Control signal VFYL0 is asserted and VFYR0 is negated to allow the logic state of node N1 to propagate through logic gates 92, 22, 24, 26, and 28 to line segment 54 without a competing input from NAND logic gate 90. If memory array 18 was being verified, program/erase controller 46 will provide a negated control signal VFYL0 and an asserted control signal VFYR0 to allow a bit line signal from a memory cell of memory array 18 to determine a state of latch 60 and propagate through logic gates 90, 26, and 28 to line segment 54.

Sense amplifier 20 is also used to sense and amplify data in the case of a normal read operation. During a normal read operation, sense amplifier 20 receives a bit line signal at either A0 or A1 that is stored in latch 60. If memory array 16 is being read, reference enable control signal REFENL is a logic low voltage so that transistor 86 is substantially non-conductive. Control signal REFENR is a logic high voltage so that transistor 74 is conductive, allowing current source 76 to relatively weakly pull-down A1 and subsequently node N2 of latch 60. Control signals REFENL and REFENR are clocked control signals so that neither is asserted as a logic high at the same time. Latch 60 is enabled when control signal SALAT is asserted as a logic high. A differential signal is then provided to read global data lines GDL and GDLB by sense amplifier 20 at nodes N2 and N1, respectively. A control gate of transistor 78 is coupled to node N1 and is conductive when node N1 is storing a logic low voltage. Also, a control gate of transistor 62 is coupled to node N2 and is conductive when node N2 is storing a logic low voltage. Control signals GDLENB are provided to P-channel transistors 64 and 80 and function to couple VDD to drive a logic high voltage to one of the normal read global date lines during the normal read operation depending on the latched logic state of storage nodes N1 and N2.

By now it should be appreciated that there has been provided a non-volatile memory having a verify-read data path, separate from a normal read path, that requires less surface area of an integrated circuit and is simpler to implement than a prior art verify-read path that uses tristateable drivers.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The term "coupled," as used herein, is not intended to be limited to a direct coupling or a mechanical coupling.

What is claimed is:

1. A memory, comprising:
   a first memory array;
   a first sense amplifier coupled to the first memory array that senses data from the first memory array;
   a second memory array;
   a second sense amplifier coupled to the second memory array that senses data from the second memory array;
   a verify data line coupled to a first output of the first sense amplifier and a first output of the second sense amplifier, wherein the verify data line comprises:
      a first logic circuit having a first input coupled to the first output of the first sense amplifier and an output; and
      a second logic circuit having a first input coupled to the output of the first logic circuit, a second input coupled to the first output of the second sense amplifier, and an output;
   a program/erase controller coupled to the output of the second logic circuit;
   a global data line coupled to a second output of the first sense amplifier and a second output of the second sense amplifier; and
   a global sense amplifier coupled to the global data line.

2. The memory of claim 1, wherein the second logic circuit comprises a NAND gate.

3. The memory of claim 2, wherein the second logic circuit further comprises an inverter, wherein:
   the NAND gate has a first input coupled to the output of the first logic circuit, a second input coupled to the first output of the second sense amplifier, and an output; and
   the inverter has an input coupled to the output of the NAND gate and an output coupled to the program/erase controller.

4. The memory of claim 1, further comprising a line segment for coupling the output of the first logic circuit to the first input of the second logic circuit.

5. The memory of claim 1, further comprising a third memory array coupled to the first sense amplifier, wherein the first sense amplifier is further characterized as sensing data from the third memory array and having a third output, wherein the verify data line further comprises:
   a third logic circuit having a first input coupled to the output of the first logic circuit, a second input coupled to the third output of the first sense amplifier, and an output coupled to the first input of the second logic circuit whereby the output of the first logic circuit is coupled to the first input of the second logic circuit through the third logic circuit.

6. The memory of claim 5, further comprising a fourth memory array coupled to the second sense amplifier, wherein the second sense amplifier is further characterized as sensing data from the fourth memory array and having a third output, wherein the verify data line further comprises:
   a fourth logic circuit having a first input coupled to the output of the third logic circuit, a second input coupled to the third output of the second sense amplifier, and an output coupled to the first input of the second logic circuit whereby the output of the first logic circuit is coupled to the first input of the second logic circuit through the third and fourth logic circuits.

7. The memory of claim 5, further comprising a fourth memory array coupled to the second sense amplifier, wherein the second sense amplifier is further characterized as sensing data from the fourth memory array and having a third output, wherein the verify data line further comprises:
   a fourth logic circuit having a first input coupled to the output of the second logic circuit, a second input coupled to the third output of the second sense amplifier, and an output coupled to the program/erase controller whereby the output of the second logic circuit is coupled to the program/erase controller through the fourth logic circuit.

8. The memory of claim 1 wherein the first sense amplifier comprises a cross-coupled latch.

9. The memory of claim 8, wherein the first sense amplifier further comprises a clockable current source, wherein the cross-coupled latch has a first input/output coupled to the clockable source and a second input/output coupled to the first memory array.

10. The memory of claim 9, wherein the second output of first sense amplifier comprises the second input/output of the cross-coupled latch.

11. A method of operating a memory having a plurality of memory arrays coupled to both a first read path and a second read path, the method comprising:
   providing a plurality of cascaded logic circuits in the second read path, each of the plurality of cascaded logic circuits corresponding to a memory array of the plurality of memory arrays;
   reading data from a first selected memory array of the plurality of memory arrays by coupling data to the first read path; and
   contemporaneously reading data from a second selected memory array of the plurality of memory arrays in which a logic operation is performed by each of the plurality of cascaded logic circuits in the second read path in response to the contemporaneously read data.

12. The method of claim 11, wherein the step of contemporaneously reading data from the second selected memory array is further characterized by the logic operation comprising a NAND function for each memory array of the plurality of memory arrays.

13. The method of claim 12, wherein the step of contemporaneously reading data from the second selected memory array is further characterized by the logic operation further comprising an inversion function for each memory array of the plurality of memory arrays.

14. The method of claim 13, wherein the step of contemporaneously reading data from the second selected memory array is further characterized as verifying a programming performed on the second selected array.

15. A memory having a first mode and a second mode of operation, wherein the first mode can function contemporaneously with the second mode, comprising:
   a first memory array;
   a first sense amplifier coupled to the first memory array that senses data from the first memory array;
   a second memory array;
   a second sense amplifier coupled to the second memory array that senses data from the second memory array;
   a verify data line coupled to a first output of the first sense amplifier and a first output of the second sense amplifier, wherein the verify data line comprises:
      a first continuous segment;
      a second continuous segment;
      a first logic circuit having a first input coupled to the first output of the first sense amplifier and an output coupled to a first end of the first continuous segment; and
      a second logic circuit having a first input coupled to a second end of the first continuous segment, a second input coupled to the first output of the second sense amplifier, and an output coupled to a first end of the second segment;
   a program/erase controller coupled to a second end of the second segment;
   a global data line coupled to second output of the first sense amplifier and a second output of the second sense amplifier; and
   a global sense amplifier coupled to the global data line.

16. The memory of claim 15, further wherein:
   during a contemporaneous functioning of the first mode and the second mode, the first sense amplifier can provide data on the verify data line while the second sense amplifier provides data on the global data line.

17. The memory of claim 15, wherein:
   the first and second memory arrays are non-volatile memory arrays;
   the first mode comprises writing data and verifying that data has been written; and
   the second mode comprises reading data.

18. The memory of claim 15, wherein the first continuous segment crosses over the second array.

19. The memory of claim 15, further comprising a third memory array coupled to the first sense amplifier, wherein the first sense amplifier is further characterized as sensing data from the third memory array and having a third output, wherein the verify data line further comprises:
   a third logic circuit having a first input coupled to the output of the first logic circuit, a second input coupled to the third output of the first sense amplifier, and an output coupled to the first input of the second logic circuit whereby the output of the first logic circuit is coupled to the first input of the second logic circuit through the third logic circuit.

20. The memory of claim 19, wherein the first sense amplifier comprises a cross-coupled latch that stores data from one of a group consisting of the first memory array and the third memory array, wherein the first output is provided with the data from the cross-coupled latch in response to a verify signal corresponding to the first memory array and the third output is provided with the data from the cross-coupled latch in response to a verify signal corresponding to the third memory array.

* * * * *